(12) United States Patent
Hou et al.

(10) Patent No.: US 7,871,277 B2
(45) Date of Patent: Jan. 18, 2011

(54) ELECTRONIC DEVICE WITH RETRACTABLE CONNECTOR

(75) Inventors: Ding-Teng Hou, Sanchung (TW); Li-Chin Chen, Sanchung (TW)

(73) Assignee: Kye Systems Corp., Sanchung (TW)

(*) Notice: Subject to any disclaimer, the term of this patent is extended or adjusted under 35 U.S.C. 154(b) by 243 days.

(21) Appl. No.: 12/232,557

(22) Filed: Sep. 19, 2008

(65) Prior Publication Data
US 2010/0022107 A1    Jan. 28, 2010

(30) Foreign Application Priority Data
Jul. 22, 2008    (TW) .............................. 97127731 A (51) Int. Cl.
*H01R 13/44* (2006.01)
(52) U.S. Cl. ..................................................... 439/131
(58) Field of Classification Search ................ 439/131, 439/141, 607.01, 353, 136, 140, 139, 350; 361/752
See application file for complete search history.

(56) References Cited

U.S. PATENT DOCUMENTS

| 6,808,400 | B2* | 10/2004 | Tu .............................. 439/131 |
| 7,104,814 | B1* | 9/2006 | She et al. ..................... 439/131 |
| 2007/0015407 | A1* | 1/2007 | Loftus ........................ 439/607 |

* cited by examiner

*Primary Examiner*—Edwin A. Leon
(74) *Attorney, Agent, or Firm*—Bacon & Thomas, PLLC (57) ABSTRACT

An electronic device with a retractable connector has a housing, an electronic assembly being mounted in the housing and a positioning assembly being mounted between the housing and the electronic assembly. The housing has at least one positioning detent being formed in an inner surface of the housing. The electronic assembly has a circuit board and a connector being mounted on the circuit board and through the connector hole of the housing. The positioning assembly is securely mounted on the circuit board and selectively engages in the positioning detent of the housing. Since positioning structures are formed on the housing and the circuit board, the volume of the electronic device is reduced. In addition, no additional holes are formed through the housing and an original design and an appearance of the housing are kept.

16 Claims, 7 Drawing Sheets

ELECTRONIC DEVICE WITH RETRACTABLE CONNECTOR

BACKGROUND OF THE INVENTION

1. Field of the Invention

The present invention relates to an electronic device, especially to an electronic device with a retractable connector for conveniently carrying and completeness of a housing of the electronic device.

2. Description of the Prior Arts

A housing of an electronic device such as but not limited to card reader has two opposite ends, a card recess and a connector. The card recess is formed in one end of the housing and allows a memory card such as but not limited to Secure Digital (SD) card, Subscriber Identity Module (SIM) card and the like to be insert inside. The connector is mounted on the other end of the housing, is selectively connected to a computer or another electronic device and may be a Universal Serial Bus (USB) connector.

A conventional USB connector is securely mounted on the housing. A cap is mounted around the USB connector to protect the USB connector from being damaged. Therefore, the cap should be removed from the USB connector before the USB connector is connected to another electronic device. Thus, the cap is possibly getting lost. Another conventional USB connector is pivotally connected to the housing, may be stored in the housing while being unused and needs to be pivoted toward outside of the housing before being connected to another electronic device. The conventional USB connectors are unfriendly to users.

Figure 7:
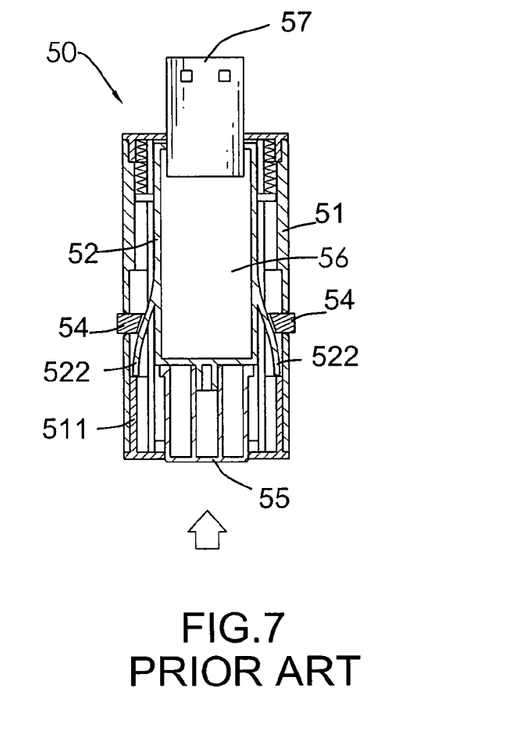
FIG. 7 is an operational upper view in partial section of a conventional electronic device in accordance with the prior art, showing a stud being retracted in a housing and a connector protruding outside of the housing.
Figure 8:
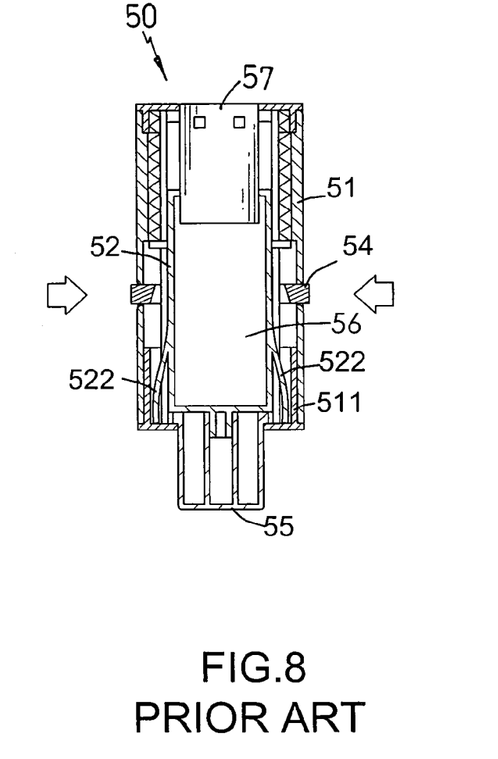
FIG. 8 is an operational upper view in partial section of the electronic device in FIG. 7, showing the stud protruding outside of the housing and the connector being retracted in the housing.

With reference to FIGS. 7 and 8, a conventional electronic device (50), such as a portable flash memory device, comprises a housing (51), a sliding assembly and an electronic assembly.

The housing (51) has a front end, a rear end, two opposite sides, an inner surface, a connector hole, an inserting hole, two pushing holes and two stoppers (511). The connector hole is formed through the front end of the housing (51). The inserting hole is formed through the rear end of the housing (51). The pushing holes are respectively formed through the sides of the housing (51). The stoppers (511) are respectively formed on the inner surface of the housing (51) near the inserting hole.

The sliding assembly is mounted in the housing (51) and has a sliding casing (52) and two pushing studs (54) and a stud (55). The sliding casing (52) is mounted in the housing (51) and has a front end, a rear end, two opposite sides and two resilient leaves (522). The resilient leaves (522) are respectively formed on the sides of the sliding casing (52) and selectively engage the stoppers (511) of the housing (51). The pushing studs (54) are respectively mounted in the pushing holes of the housing (51) and abut and selectively push the resilient leaves (522) of the sliding casing (52). The stud (55) is mounted on the rear end of the sliding casing (52) and in the inserting hole of the housing (51) and selectively protrudes out of the inserting hole of the housing (51).

The electronic assembly is mounted in the sliding casing (52) and has a circuit board (56) and a connector (57). The circuit board (56) is mounted in the sliding casing (52) and has a front edge. The connector (57) is mounted on the front edge of the circuit board (56) and in the connector hole of the housing (51) and selectively protrudes out of the connector hole of the housing (51).

When the stud (55) is pushed into the housing (51), the sliding casing (52) and the electronic assembly are moved toward the front end of the housing (51). Until the resilient leaves (522) engage the stoppers (511) of the housing (51), the sliding casing (52) and the electronic assembly are positioned in a specific position in the housing (51). Thus, the connector (57) protrudes out of the connector hole of the housing (51) and can be connected to another electronic device.

When the pushing studs (54) are pushed to disengage the resilient leaves (522) from the stoppers (511) of the housing (51), the sliding casing (52) can be moved toward the rear end of the housing (51). Therefore, the connector (57) is retracted into the housing (51) and the stud (55) protrudes out of the inserting hole of the housing (51).

The electronic device as described may be a card reader while a memory card is substitute for the stud (55). However, the conventional electronic device (50) with the retractable connector (57) should have the pushing holes being formed through the housing (51). Therefore, an original design and an appearance of the housing (51) are spoiled. In addition, the resilient leaves (522) of the sliding casing (52) may gradually fail and cause movement of the sliding casing (52) and the electronic assembly while the connector (57) is connected to another electronic device. Furthermore, the sliding casing (52) occupies spaces in the housing (51) and, therefore, volume of the electronic device (50) can not be reduced.

To overcome the shortcomings, the present invention provides an electronic device with a retractable connector to mitigate or obviate the aforementioned problems.

SUMMARY OF THE INVENTION

The main objective of the present invention is to provide an electronic device with a retractable connector. The electronic device has a housing, an electronic assembly being mounted in the housing and a positioning assembly being mounted between the housing and the electronic assembly. The housing has at least one positioning detent being formed in an inner surface of the housing. The electronic assembly has a circuit board and a connector being mounted on the circuit board and through the connector hole of the housing. The positioning assembly is securely mounted on the circuit board and selectively engages in the positioning detent of the housing.

Since positioning structures are formed on the housing and the circuit board, the volume of the electronic device is reduced. In addition, no additional holes are formed through the housing and an original design and an appearance of the housing are kept.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
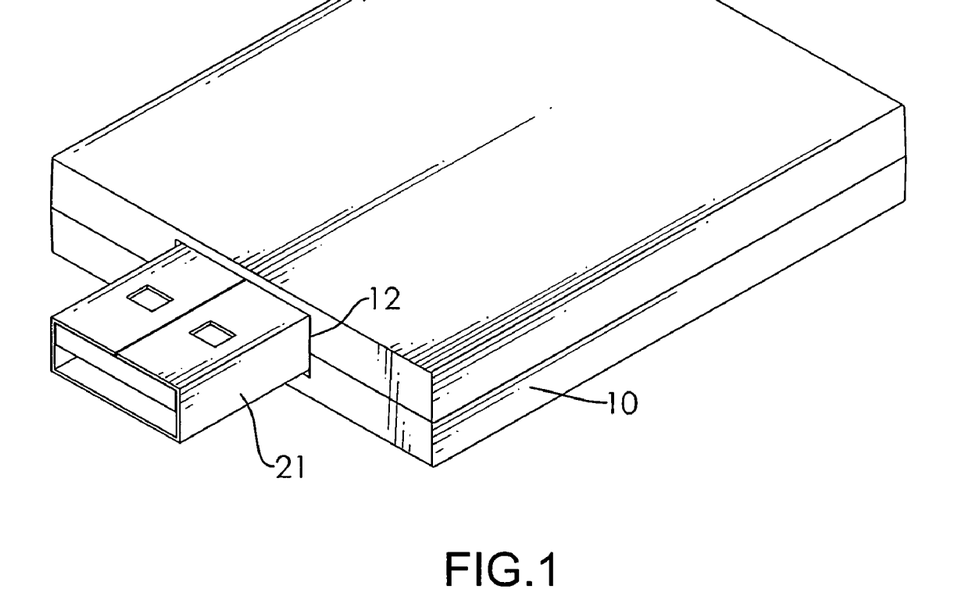
FIG. 1 is a perspective view of an electronic device with a retractable connector in accordance with the present invention.
Figure 2:
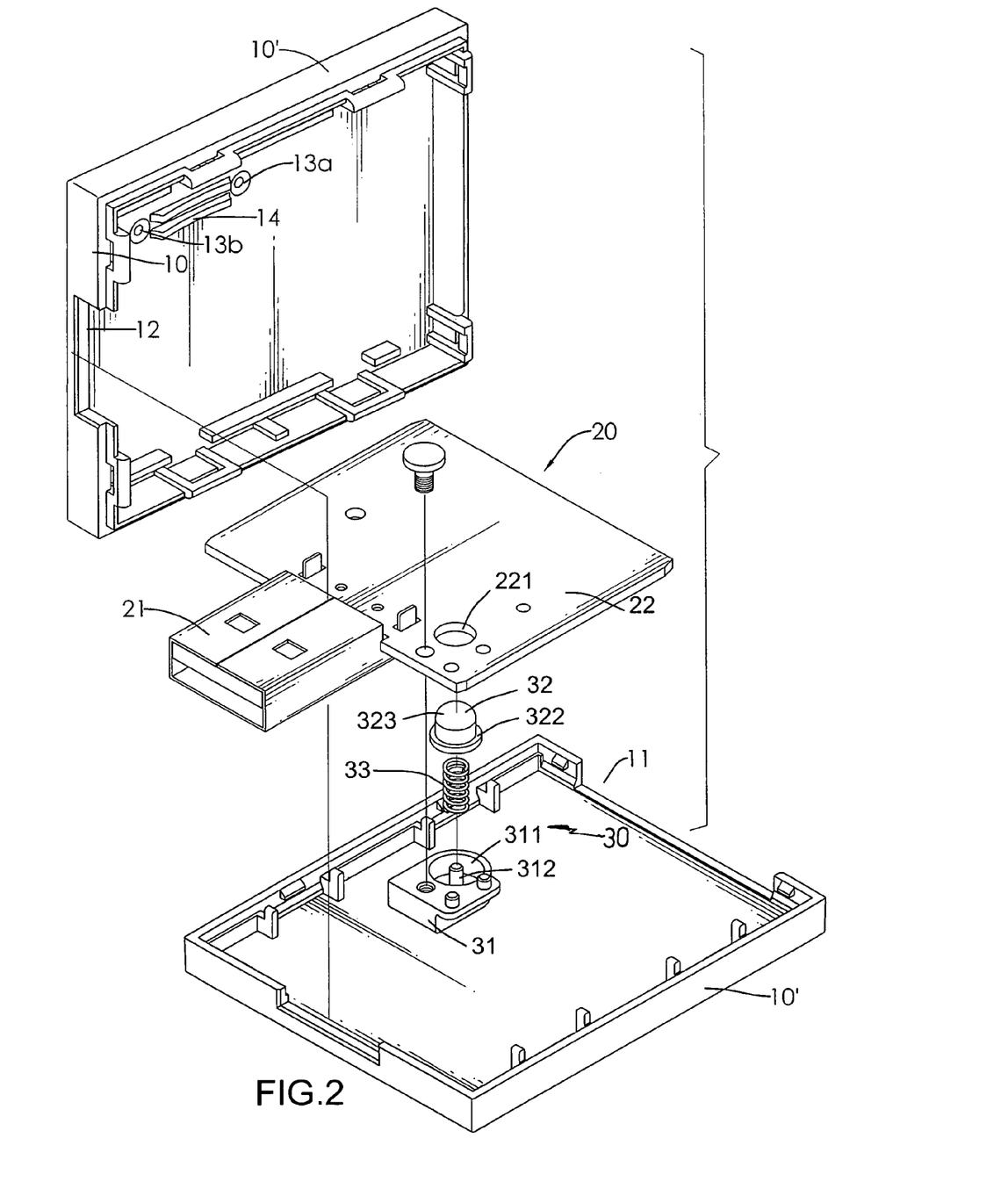
FIG. 2 is an exploded perspective view of the electronic device in FIG. 1.
Figure 3:
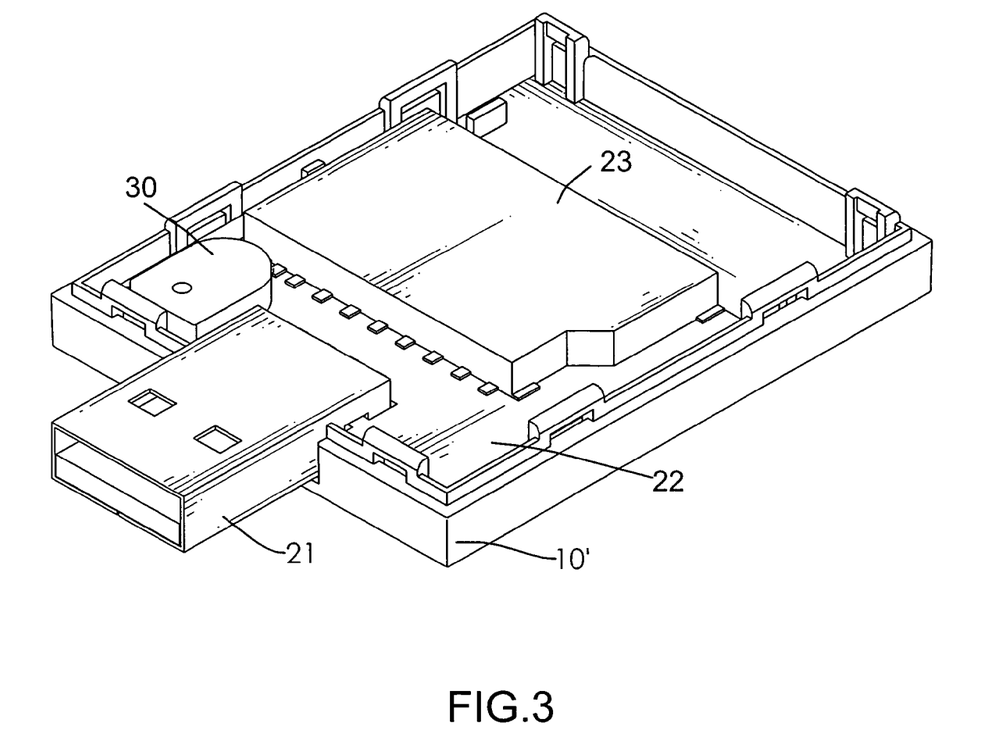
FIG. 3 is partially perspective view of the electronic device in FIG. 1, showing one half-housing being omitted.

With reference to FIGS. 1 to 3, an electronic device with a retractable connector in accordance with the present invention comprises a housing (10), an electronic assembly (20) and a positioning assembly (30).

The housing (10) may be formed by attaching two half-housings (10'), and has a front end, a rear end, an inner surface, an inserting hole (11), a connector hole (12), a resistant element (14) and a positioning portion; the positioning portion can be positioning detent (13a, 13b).

The inserting hole (11) is formed through the rear end of the housing (10). The connector hole (12) is formed through the front end of the housing (10).

The resistant element (14) is formed on the inner surface of the housing (10) near the connector hole (12) of the housing (10), may be implement with two elongated and trapezoid ribs and has two opposite ends. The ends of the resistant element (14) are inclined and respectively correspond to the front end and the rear of the housing (10).

Each positioning detent (13a, 13b) is formed in the inner surface of the housing (10), may be adjacent to the resistant element (14) and may be implemented with an indentation. The housing (10) may have two positioning detents (13a, 13b) respectively corresponding to the ends of the resistant element (14).

Figure 4:
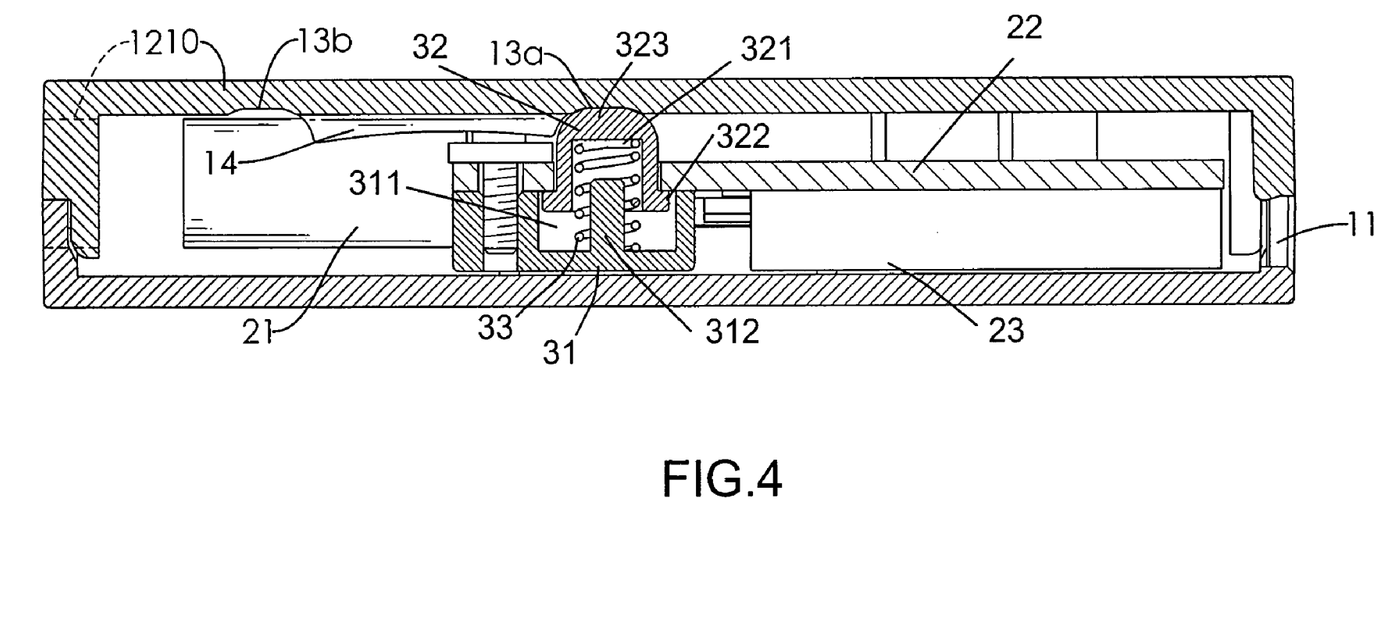
FIG. 4 is a side view in partial section of the electronic device in FIG. 1, showing a connector being retracted in the housing.

With further reference to FIG. 4, the electronic assembly (20) is mounted in the housing (10) and has a circuit board (22), an electronic component (23) and a connector (21).

The circuit board (22) is slidably mounted in the housing (10), may be slidably mounted between the half-housings (10') of the housing (10) and has a front edge, a rear edge, a first surface, a second surface and a through hole (221). The first surface of the circuit board (22) may correspond to the resistant element (14) of the housing (10). The through hole (221) of the circuit board (22) is formed through the circuit board (22) and selectively corresponds to the resistant element (14) and the positioning detent (13a, 13b) of the housing (10).

The electronic component (23) is attached to and is connected electrically to the circuit board (22) and may be a card reader, a portable flash memory device, a wireless receiver or a wireless network card.

The connector (21) is mounted on the front edge of the circuit board (22), is electrically connected to the circuit board (22) and the electronic component (23), selectively protrudes out of the connector hole (221) of the housing (10) to connect to an other electronic device and may be a Universal Serial Bus (USB) connector.

The positioning assembly (30) is mounted between the housing (10) and the circuit board (22) of the electronic assembly (20) and has a base (31), a positioning button (32) and a resilient element (33).

The base (31) is securely mounted on the second surface of the circuit board (22), corresponds to the through hole (221) of the circuit board (22) and has a mounting recess (311) and a positioning rod (312). The mounting recess (311) is formed in the base (31) and corresponds to the through hole (221) of the circuit board (22). The positioning rod (312) is formed in and protrudes from the mounting recess (311) of the base (31).

The positioning button (32) is mounted on the first surface of the circuit board (22), selectively engages in the positioning detent (13a, 13b) of the housing (10), may selectively abut the resistant element (14) of the housing (10), may be mounted through the through hole (221) of the circuit board (22), may be mounted in the mounting recess (311) of the base (31) and may have an inner end, an outer surface, a mounting recess (321), a flange (322) and a positioning end (323). The mounting recess (321) is formed in the inner end of the positioning button (32). The flange (322) is radially formed around the outer surface of the positioning button (32) adjacent to the inner end of the positioning button (32) and abuts the second surface of the circuit board (22). The positioning end (323) is round, selectively engages in the positioning detent (13a, 13b) of the housing (10) and selectively abuts the resistant element (14) of the housing (10).

The resilient element (33) is mounted on the inner end of the positioning button (32), may be mounted in the mounting recess (311) of the base (31), may be mounted in the mounting recess (321) of the positioning button (32), may be mounted around the positioning rod (312) of the base (31) to allow the positioning button (32) to slide back and forth and may be a spring. Therefore, the resilient element (33) pushes the positioning button (32) and allows the positioning end (323) of the positioning button (32) to securely engage in the positioning detent (13a, 13b) of the housing (10).

While the electronic component (23) of the electronic device is a card reader and no memory card is inserted into the housing (10), the positioning end (323) of the positioning button (32) engages in the positioning detent (13a) of the housing (10) and the connector (21) of the electronic assembly (20) is retracted in the housing (10).

Figure 5:
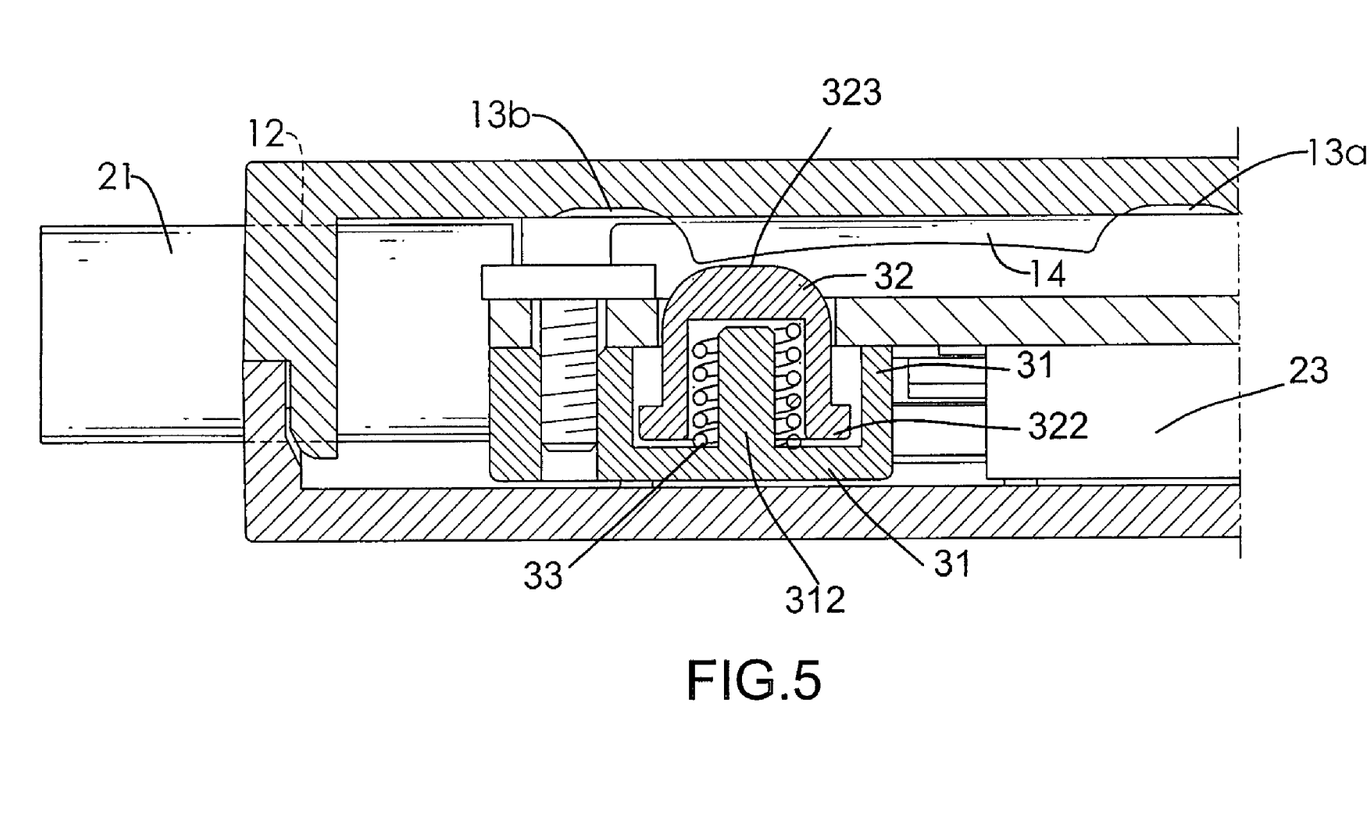
FIG. 5 is an enlarged side view in partial section of the electronic device in FIG. 1, showing a memory card being inserted into the housing and the connector being protruding toward outside of the housing.
Figure 6:
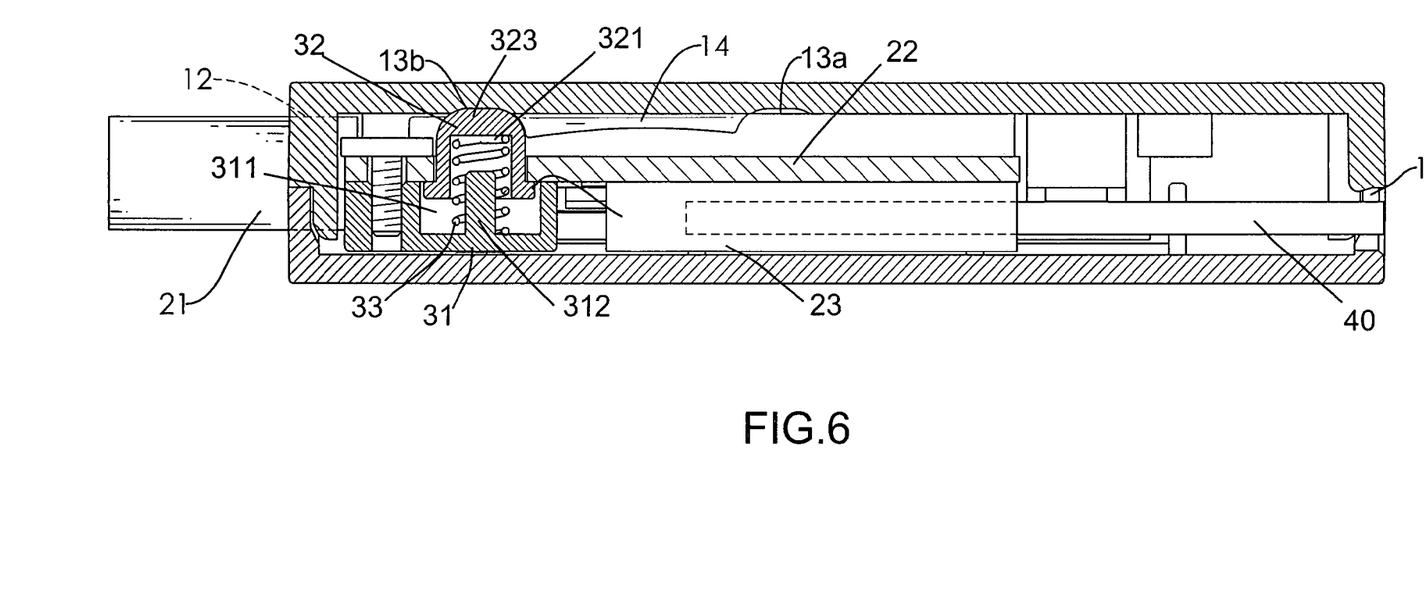
FIG. 6 is a side view in partial section of the electronic device in FIG. 1, showing the memory card being stored in the housing and the connector protruding outside of the housing.

With further reference to FIGS. 5 and 6, while a memory card (40) is mounted through the inserting hole (11) of the housing (10) and is electrically connected to the electronic component (23) of the electronic assembly (20), the electronic assembly (20) is pushed by the memory card (40) toward the front end of the housing (10). Thus, the positioning end (323) of the positioning button (32) disengages from one positioning detent (13a) of the housing (10) and moves along one inclined end of the resistant element (14). Consequently, the resilient element (33) of the positioning assembly (30) is compressed by the resistant element (14) of the housing (10) and the connector (21) of the electronic assembly (20) protrudes out of the connector hole (12) of the housing (10).

While the positioning button (32) moves across the resistant element (14) of the housing (10) and slides along the other inclined end of the resistant element (14) of the housing (10), the positioning end (323) of the positioning button (32) engages in the other positioning detent (13b) of the housing (10). Thus, the connector (21) totally protrudes out of the connector hole (12) of the housing (10) and is positioned in a specific position. Therefore, the connector (21) is connected to a computer to allow the computer to read data in the memory card (40).

Other than the elongated and trapezoid ribs, the resistant element (14) may also be implemented with a recess with a rough bottom, a retaining wall, a cushion, multiple protrusions or the like that provide resistant function to the positioning button (32). Therefore, when the connector (21) is connected the computer, the resistant element (14) stops the pushing button (32) from moving toward the rear end of the housing (10) and the connector (21) from retracting into the housing (10). As for the present embodiment, the inclined end of each elongated and trapezoid rib that corresponds to the front end of the housing (10) may protrude higher the other inclined end of each elongated and trapezoid rib that corresponds to the rear end of the housing (10) to provide different resistant force to the positioning button (32).

The electronic device with the retractable connector as described has the following advantages. Positioning structures are formed on the housing (10) and the circuit board (22), which are original components of the electronic device. Therefore, a volume of the electronic device is reduced to allow convenient carrying of the electronic device. In addition, no additional holes should be formed through the housing (10) and an original design and an appearance of the housing (10) are kept. Furthermore, while the resilient element (33) of the positioning assembly (30) is a spring, resilience of the resilient element (33) is stable. Thus, the positioning assembly (30) and the electronic assembly (20) is positioned in a specific position and do not slide relative to the housing (10) by haphazard.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An electronic device comprising
   a housing having
      a front end;
      a rear end;
      an inner surface;
      an inserting hole being formed through the rear end of the housing;
      a connector hole being formed through the front end of the housing;
      a resistant element being formed on the inner surface of the housing near the connector hole of the housing and having two opposite ends; and
      two positioning detent being formed in the inner surface of the housing and respectively corresponding to the ends of the resistant element;
   an electronic assembly being mounted in the housing and having
      a circuit board being slidably mounted in the housing and having
         a front edge;
         a rear edge;
         a first surface corresponding to the resistant element of the housing; and
         a second surface;
      an electronic component being attached to and being connected electrically to the circuit board; and
      a connector being mounted on the front edge of the circuit board, being electrically connected to the circuit board and the electronic component and selectively protruding out of the connector hole of the housing; and
   a positioning assembly being mounted between the housing and the circuit board of the electronic assembly and having
      a positioning button being mounted on the first surface of the circuit board, selectively engaging in the positioning detents of the housing, selectively abuts the resistant element of the housing and having an inner end; and
      a resilient element being mounted on the inner end of the positioning button.

2. The electronic device as claimed in claim 1, wherein the resistant element of the housing are elongated and trapezoid ribs; and the positioning detents of the housing are indentations.

3. The electronic device as claimed in claim 2, wherein
   the circuit board of the electronic assembly further has a through hole being formed through the circuit board and selectively corresponding to the resistant element and the positioning detents of the housing;
   the positioning assembly further has a base being securely mounted on the second surface of the circuit board, corresponding to the through hole of the circuit board and having
      a mounting recess being formed in the base and corresponding to the through hole of the circuit board; and
      a positioning rod being formed in and protruding from the mounting recess of the base;
   the positioning button of the positioning assembly is mounted through the through hole of the circuit board and is mounted in the mounting recess of the base; and
   the resilient element of the positioning assembly is mounted in the mounting recess of the base and is mounted around the positioning rod of the base.

4. The electronic device as claimed in claim 3, wherein the positioning button of the positioning assembly further has
   an outer surface;
   a mounting recess being formed in the inner end of the positioning button;
   a flange being radially formed around the outer surface of the positioning button adjacent to the inner end of the positioning button and abutting the second surface of the circuit board; and
   a positioning end being round, selectively engaging in the positioning detents of the housing and selectively abutting the resistant element of the housing.

5. The electronic device as claimed in claim 1, wherein the connector of the electronic assembly is a Universal Serial Bus (USB) connector.

6. The electronic device as claimed in claim 2, wherein the connector of the electronic assembly is a Universal Serial Bus (USB) connector.

7. The electronic device as claimed in claim 3, wherein the connector of the electronic assembly is a Universal Serial Bus (USB) connector.

8. The electronic device as claimed in claim 4, wherein the connector of the electronic assembly is a Universal Serial Bus (USB) connector.

9. The electronic device as claimed in claim 1, wherein the electronic component of the electronic assembly is selected from the group consisting of a card reader, a portable flash memory device, a wireless receiver and a wireless network card.

10. The electronic device as claimed in claim 2, wherein the electronic component of the electronic assembly is selected from the group consisting of a card reader, a portable flash memory device, a wireless receiver and a wireless network card.

11. The electronic device as claimed in claim 3, wherein the electronic component of the electronic assembly is selected from the group consisting of a card reader, a portable flash memory device, a wireless receiver and a wireless network card.

12. The electronic device as claimed in claim 4, wherein the electronic component of the electronic assembly is selected from the group consisting of a card reader, a portable flash memory device, a wireless receiver and a wireless network card.

13. A card reader comprising:
   a housing having a connector and an electronic assembly therein, and the connector and the electronic assembly being movable relatively to the housing with one end of the electronic assembly electrically connected to the connector and the other end of the electronic assembly adapted to electrically receive a removable memory card; wherein
   the electronic assembly has a positioning button, and an inner surface of the housing has a positioning portion that is located relatively to the positioning button;
   a resilient element keeps the positioning button constantly biased against the inner surface of the housing and the positioning button is movable in the housing so as to be positioned at the positioning portion;
   the connector protrudes from the housing when the removable memory card is inserted into the electronic assembly; and when the connector is pushed back within the housing to eject the removable memory card, the removable memory card is able to be withdrawn from the housing.

14. The card reader as claimed in claim 13, wherein a side of the positioning portion has a resistant element.

15. The card reader as claimed in claim 14, wherein each side of the resistant element has a positioning portion.

16. The card reader as claimed in claim 13, wherein the electronic assembly is selected from the group consisting of a card reader, a portable flash memory device, a wireless receiver and a wireless network card.

* * * * *